United States Patent [19]

Tran

[11] Patent Number: 5,537,570
[45] Date of Patent: Jul. 16, 1996

[54] CACHE WITH A TAG DUPLICATE FAULT AVOIDANCE SYSTEM AND METHOD

[75] Inventor: Hiep Tran, Carrollton, Tex.

[73] Assignee: Texas Instruments Incorporated, Dallas, Tex.

[21] Appl. No.: 136,176

[22] Filed: Oct. 12, 1993

[51] Int. Cl.⁶ ........................................ G06F 12/00
[52] U.S. Cl. ................ 395/455; 395/445; 395/446; 364/243.41; 364/243.45; 364/DIG. 1
[58] Field of Search .................... 395/449, 446, 395/445, 455; 364/243.41, 243.45

[56] References Cited

U.S. PATENT DOCUMENTS

| | | | |
|---|---|---|---|
| 3,623,017 | 11/1971 | Lowell | 340/172.5 |
| 3,715,729 | 2/1973 | Mercy | 340/172.5 |
| 4,254,475 | 3/1981 | Cooney et al. | 395/550 |
| 4,816,700 | 3/1989 | Imel | 307/269 |
| 4,819,164 | 4/1989 | Branson | 395/550 |
| 4,821,229 | 4/1989 | Jauragui | 395/550 |
| 4,985,640 | 1/1991 | Grochowski et al. | 307/269 |
| 5,079,440 | 1/1992 | Roberts et al. | 307/269 |
| 5,317,718 | 5/1994 | Jouppi | 395/425 |
| 5,386,547 | 1/1995 | Jouppi | 395/425 |

FOREIGN PATENT DOCUMENTS

| | | |
|---|---|---|
| 0242010A1 | 10/1987 | European Pat. Off. . |
| R130467.4 | 6/1993 | Germany . |
| 22285998 | 8/1990 | United Kingdom . |
| 2260631 | 4/1993 | United Kingdom . |

OTHER PUBLICATIONS

IBM Technical Disclosure Bulletin "Double Frequency Clock Generator)" Aug. 1991 Nishihara vol. 34, No. 3 pp. 55–57.

"Advanced Clock Controller Cuts Power Needs, Size of Static CMOS Systems" (Electronic Design Oct. 4, 1984) Curtis A Mroz & Walt Niewierski Oct. 1984 pp. 185–191.

"Clocking Subsystems Pace High Performance Logic" (Computer Design Nov. 1, 1987) Jacob Shuhani & Don Draper Nov. 1987 H20, pp. 95–100.

Microprocessor and Peripheral Handbook vol. 1 Microprocessor Intel 1987 p. 53.1, 3–24 BIS 3–25, Fig. 21.

*Primary Examiner*—Tod R. Swann
*Assistant Examiner*—Frank J. Asta
*Attorney, Agent, or Firm*—J. Dennis Moore; James C. Kesterson; Richard L. Donaldson

[57] ABSTRACT

A method for avoiding a tag duplicate fault. The method includes the steps of using a master - slave tag; selecting a first tag as a master and a second tag as a slave; inhibiting the second tag from initiating a hit signal when the first tag is set for a hit condition, and enabling the second tag to initiate a bit signal when the first tag is set for a miss condition.

2 Claims, 3 Drawing Sheets

5,537,570

CACHE WITH A TAG DUPLICATE FAULT AVOIDANCE SYSTEM AND METHOD

NOTICE

Copyright ©, Texas Instruments Incorporated, 1993. A portion of the disclosure of this patent document contains material which is subject to copyright protection. The copyright owner has no objection to facsimile reproduction by anyone of the patent document or the patent disclosure, as it appears in the U.S. Patent and Trademark Office, patent file or records, but otherwise reserves all rights in its copyright whatsoever.

TECHNICAL FIELD OF THE INVENTION

This invention relates to a processing system with a cache, and more particularly to a cache with a tag and fault avoidance circuit.

BACKGROUND OF THE INVENTION

In the prior art, processing systems including large cache memories consume large amounts of power. With the advent of portable systems, there has been an increased need to reduce power consumption particularly in segmentable areas of a processing system which remain idle. One such area is the cache.

SUMMARY OF THE INVENTION

A method is presented for avoiding a tag duplicate fault in a 2-way set associative cache memory having, in the same level, a first tag array and a second tag array, each storing tags, and having a data RAM storing the cache data. The first tag array is selected as a master array, and second tag array as a slave array, there being corresponding lines of memory in said first tag array and the second tag array comprising sets. A tag address associated with a predetermined one of the sets is generated. The tag address is compared against the data stored in the line of the one of the sets in the master array while inhibiting comparison against the line of the one of the sets in the slave array is inhibited. If the result of the step of comparing is positive, the data stored in the line of said one of the sets in the master array is used to access said data RAM. However, if the result of the step of comparing is negative, the tag address is compared against the data stored in the line of the one of the sets in the slave array. The invention can be embodied in n-way cache memories.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

Figure 8:
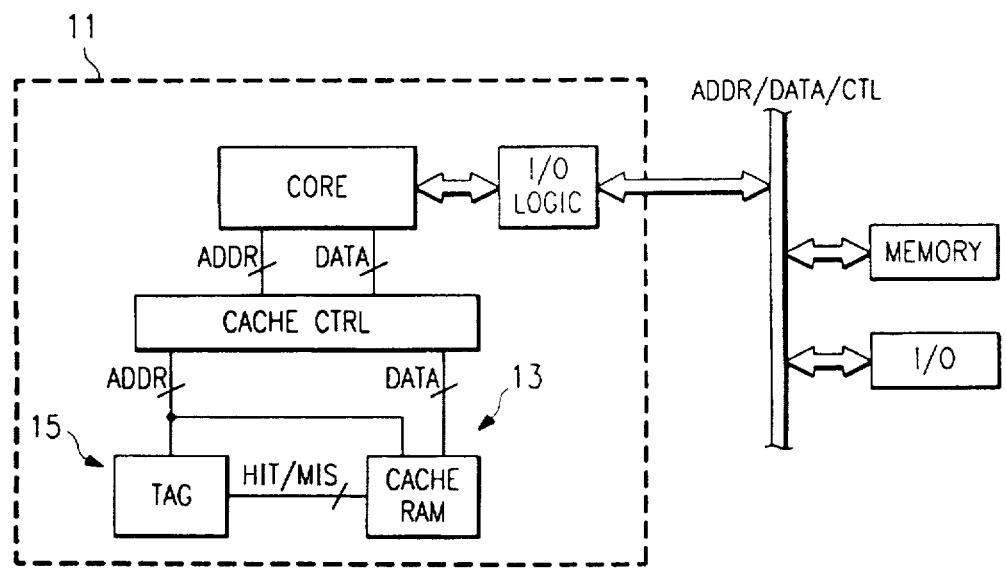
FIG. 8 is a schematic view showing a processor and system.

Referring generally to FIG. 8, the preferred embodiment of a microprocessor 11 with a low power cache 13 and tag assembly 15 is shown.

The method of low power operation of the cache includes: all output buffers during all cache operations to be inactivated except when a valid data operation is performed, a tag hit enable signal is generated, to activate the data RAM output buffers with the tag signal, data RAM output buffers which are receiving a hit state from a tag RAM are activated in order to transfer data from data RAM to a CPU data bus, tag hit signals are pre-charged to miss state, all data RAM output buffers with tag miss signals are disabled.

Figure 1:
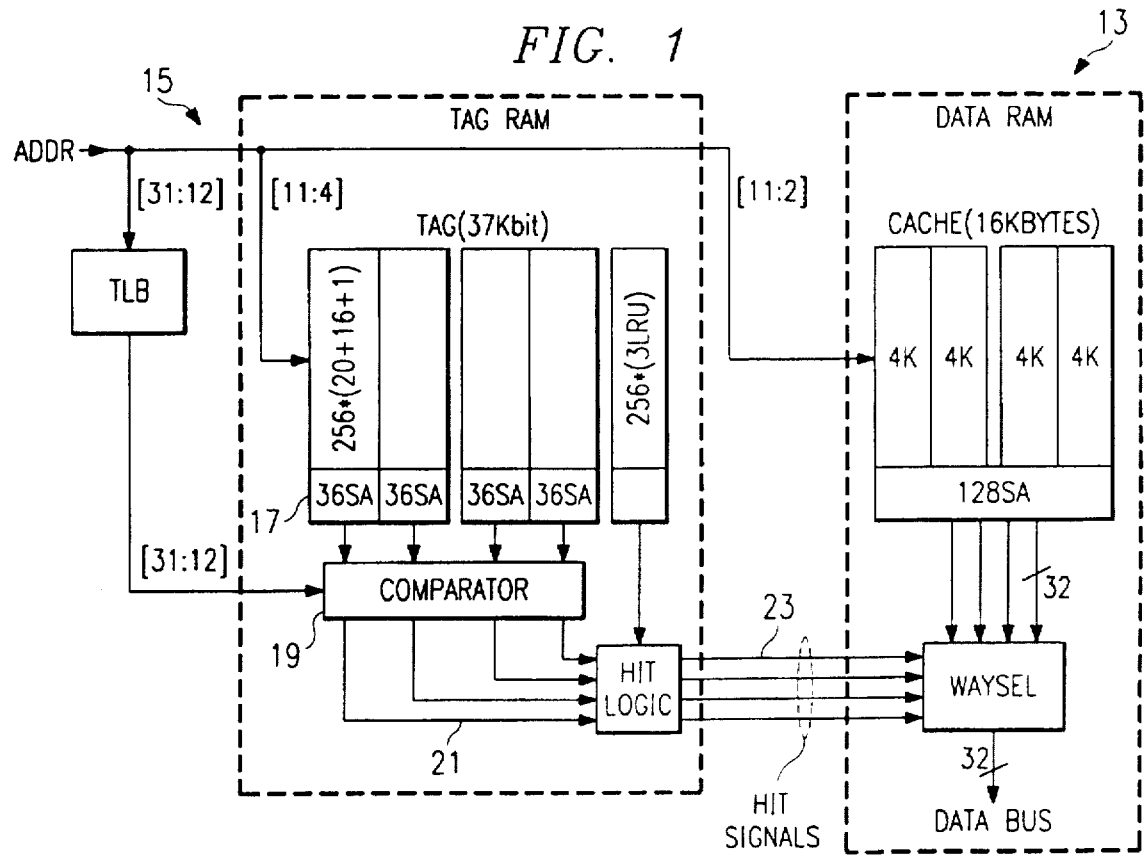
FIG. 1 is a block diagram view of the preferred embodiment of the cache with tag circuitry.
Figure 3:
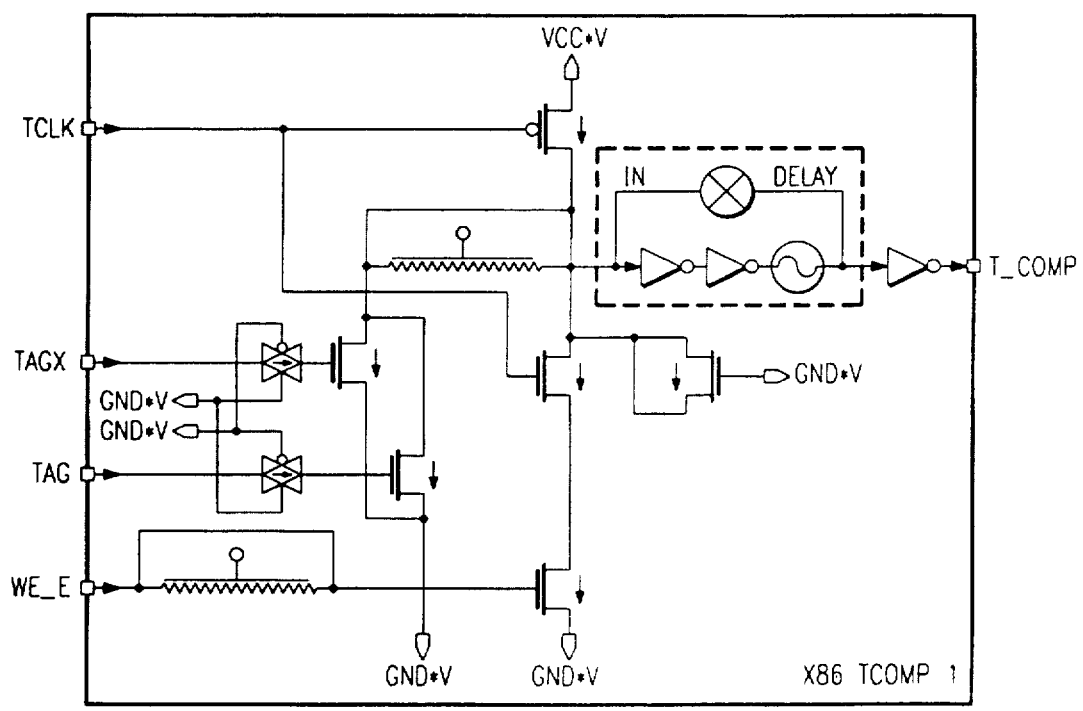
FIG. 3 is a schematic view of the tag circuitry of the preferred embodiment.

Referring to FIG. 1, the method of operation of cache 13 includes pre-charging all tag and tag complement lines (FIG. 3) to a same state; sense amp 17 activates a tag and tag complement line pair to differential states, and activating comparators 19 for determining hit or miss signals, selecting a tag signal with a slowest signal path for activating a dummy comparator 37 (FIG. 3 and FIG. 4) to generate a tag hit enable signal, enabling a tag comparator output 21 with the tag hit enable signal 23, and generating a correct tag hit state.

The method further includes generating a self-time precharge signal for tag comparators and tag hit circuitry using the tag hit enable signal.

The method of operation of cache 13 also includes a line invalidation control circuit (FIG. 5) and a tag including multiple lines; each of the multiple lines has an identical block address; at least one multiple line including block valid bits; each of the lines has local valid bits; when writing a new tag, the block valid bits and the local valid bits are reset a; control circuit to provide a line invalidation control signal for resetting local valid bits upon receiving a tag miss signal; comparing any pending read miss requests with a read miss request corresponding to the tag miss signal; aborting sending of the line invalidation control signal upon finding a match in the step of comparing.

CACHE ORGANIZATION

The microprocessor on-chip cache 13 is a unified code and data cache. The cache is used for both instruction and data accesses and acts on physical addresses. The on-chip cache is 8 Kbytes in size. The cache is organized as two-way set 25, 27 associative and each line is 4 bytes wide. The 8 Kbytes of cache memory are logically organized as 1.024 sets, each containing 2 lines.

Figure 6:
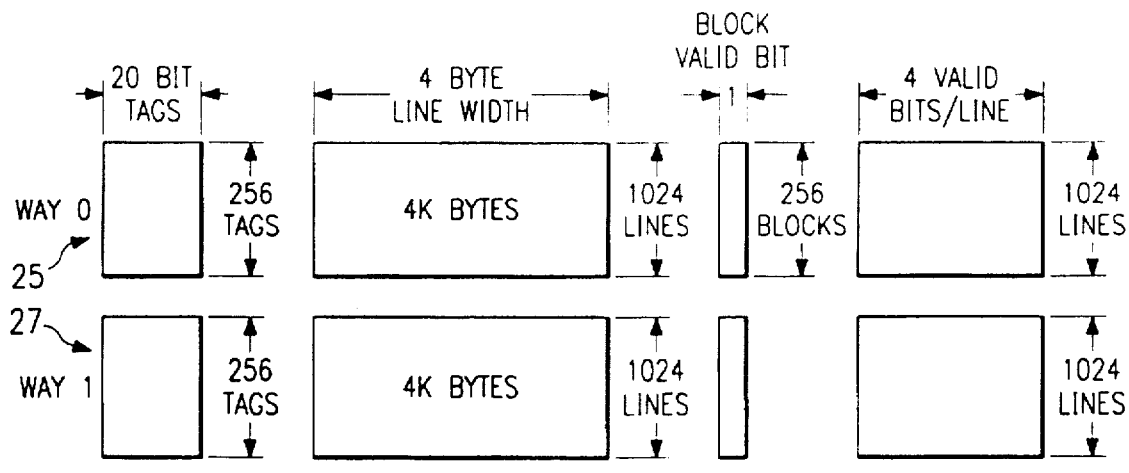
FIG. 6 is a schematic view showing the tags and multiple lines.

The cache memory is physically split into two 4-Kbyte blocks each containing 1024 lines (see FIG. 6). Associated with each 4-Kbyte block are 256 20-bit tags. This implies there are 4 lines in a block which are associated with the same tag. These 4 lines are consecutive at 16-Byte boundaries. There is a valid bit associated with every byte in a line. Hence there are 4 valid bits per line indicating which of the four data bytes actually contain valid data. There is also a valid bit associated with each block (of 4 lines), which when reset (to zero) indicates that none of the 16 bytes in the 4 lines of that block are valid. Note that when block valid bit is reset (to zero) the 16 valid bits in the block no long imply validity of data bytes in the block.

The allocation strategy of the cache is read allocate. The data space is allocated to the cache only on read misses, and not on write misses. Whenever a new tag is written into the cache, a block of data space is allocated although fewer bytes of valid data may be actually written. The write strategy of the cache is write through. All writes will drive an external write bus cycle in addition to writing to the cache if the write was a cache hit (which may be partial). This implies that a tag hit is a necessary and sufficient condition for updating the cache during a write cycle. The cache uses a LRU replacement algorithm. Note that writes where both tag and byte valid bits match are always cacheable.

CACHE LOW POWER ISSUE

Large size cache such as the one used in a microprocessor consumes a large amount of power when clocking at a high rate. Many design efforts were devoted to reduce the cache active power, one of the key design implementations in a microprocessor on-chip cache is preventing bus signals from switching except when true data have arrived to cut down the unnecessary power dissipation. The cache data RAM output bus is the target for the new circuit technique, since its switching power is particularly high. In the microprocessor on-chip cache design 32 output buffers and long metal lines are subjected to switching every time the buffers are enabled. The new circuit technique only enables the data RAM cache output buffers when the correct hit signal arrives. A four way cache architecture block diagram is shown in FIG. 1. When a tag match occurs in the tag RAM, the hit signals from the tag RAM hit logic block turn on one set of 32 from 128 data RAM output buffer in data RAM Waysel circuit and allows the data RAM data to be driven onto the data bus. Only one out of four this signals can be on at a time.

LOW POWER CIRCUIT TECHNIQUE

During a miss or non-cache cycle, the data bus is completely disconnected from the data RAM to keep the data bus quiet and save the data bus switching power. To be able to achieve this, all hit signal from the tag RAM have to be kept low (inactive) during all operations. This is accomplished by pre-charging all hit signals to miss condition, thus disconnecting data bus from all data RAM output buffers. Only when a tag hit occurs, the output buffers which received the hit states from the tag RAM are turned on to transfer the data from the data RAM to the CPU data bus. When data transfer operations are completed, all hit signals are again pre-charged to miss condition.

Figure 2:
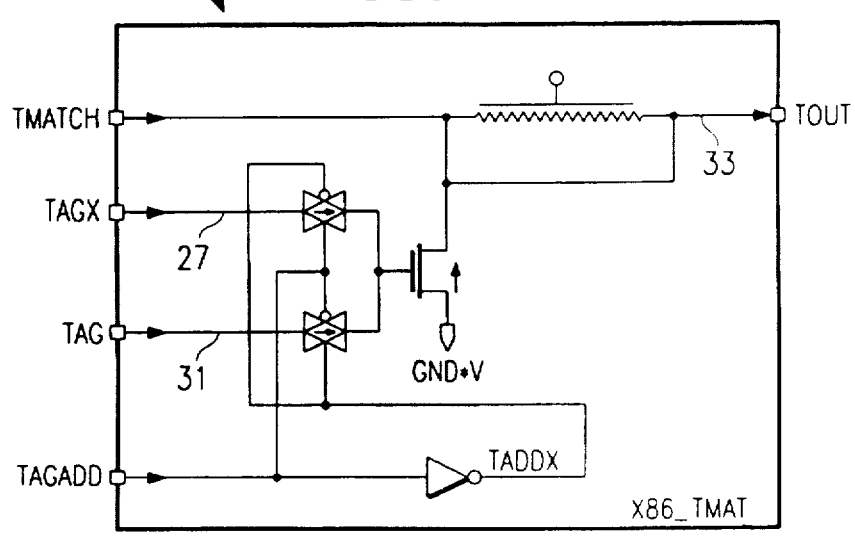
FIG. 2 is a schematic view of the tag circuitry of the preferred embodiment.

To accomplish the function described above, all tags and their complement (tagx) lines of the tag RAM are pre-charged to a same state. When the tag sense amps activate, then each tag and its tagx line are driven to differential states. The tag comparators are designed to determine hit or miss output when the tag lines are complemented. FIG. 2 shows an example of the comparator 19. Both tag inputs 29, 31 are pre-charged to low, and the comparator output 33 are pre-charged to high if it is a hit, and will be pulled low if it is a miss. Since this is reversed of what is needed for the circuit, (the output need to pre-charge to a miss) one more logic layer is needed to convert the output to the correct state.

Figure 4:
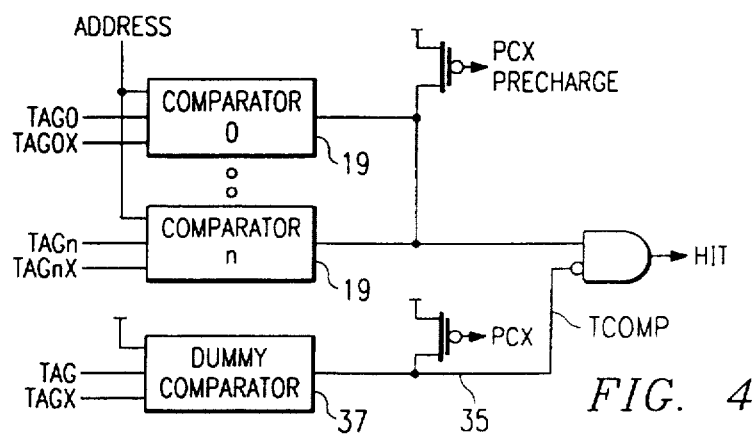
FIG. 4 is a schematic view of the tag circuitry with a dummy comparator.

Referring to FIG. 4, all comparator outputs are enabled by an enable signal 35 (TCOMP). This is the key for the new circuit. This signal is derived by using tag signals from a slowest tag block which has the slowest signal path. These signals are connected to a dummy comparator (FIG. 3) which is constructed similarly to a regular comparator for maximum signal tracking. The dummy comparator 37 are wired as such its output is switched to enable state when the tag signals arrive. The dummy comparator enable all comparator output when it fires. The tracking mechanism of the dummy comparator keeps the incorrect state (hit) of the regular comparator from propagation until the tag comparisons have been completed. This is important for high speed and low power cache operation, because a slow TCOMP signal hurts speed and too fast TCOMP increases power by allowing incorrect hit states to propagate to the output buffers.

In addition, the TCOMP signal is also used to generate a self-time pre-charge signal to pre-charge the tag comparators and the tag hit circuitry. This improves the maximum operation frequency since the comparator pre-charge period is self timed and independent to the main pre-charge clock, thus it is unlikely to be in the critical path. The block diagram of the new technique is shown in FIG. 4.

CIRCUIT FOR SELECTIVELY POWERING-UP AN ON-CHIP MICROPROCESSOR CACHE MEMORY

A processor accesses the cache when it needs to either read/write/instructions/data from/to the cache. The data or instruction fetch does not happen in every processor cycle, but is interspersed with decode, execute and write-back cycles. On every cycle, the access to the cache rams is controlled by the cache controller. The cache controller issues the cycle address and control signals to the cache rams. At the beginning of a cache read cycle (which may be instruction or data), the cache controller issues 'read_access" signal to the cache RAM indicating the beginning of a valid cache access cycle. The cache rams can use this signal to initiate a cache rams access cycle. Whenever the 'read_access' signal is not asserted, the cache rams remain inactive and thereby do not dissipate any active power. This 'read_access' signal is inclusive-or of instruction and data read_access signals.

When the timing of the 'read_access' signal is critical and it needs to be available at the beginning of a cycle, it can be made to be a superset of the signal which accurately signals a valid cache access cycle. This less optimal superset signal will meet the cycle timing requirements, but will turn on the cache access cycle more than actually required.

A case of the superset 'read_access' signal is as follows: In a single cycle cache read operation, a valid cache read operation is initiated at the beginning of a cycle. The cache control logic supports the cache to be accessed even if there are previous read miss requests that have not yet been serviced. In that case, the current cache access cycle line and tag address are compared with all of the read miss pending requests. If there is a match it indicates that there is already a request ahead of the current request which is in process of accessing the same data. In that case, the current cycle is not initiated and the cache is not accessed. This optimal 'read_access' signal can be a little too late to signal a valid cycle to the cache. The alternative is to use a superset signal which excludes address match detection but does meet the timing requirements.

MASTER-SLAVE TAG RAM DESIGN FOR TAG DUPLICATE FAULT

The tag duplicate fault occurs when the same tag is stored in two different tag arrays. This can generate an unwanted multiple tag hit fault: a catastrophic failure that can destroy the device, or cause reliability problems. Although it is unlikely to happen during normal tag operation mode, the problem can occur during the power-up or from a bad tag testing procedure.

The microprocessor on-chip cache uses the Master-Slave tag RAM design technique to prevent the tag duplicate fault. Tag RAM #1 is the master and tag RAM #0 is the slave. The tag #1 comparator output, which is pre-charged to a hit condition, is used to inhibit tag #0 hit signal. The slave hit signal only enables when the master comparator outputs a miss condition.

The technique can be applied to the tag system with multiple tag RAMs other than two for example: Cascading multiple levels of masters and a slave such as Master1—Master2—Master3—...—Slave. Master2 is the Master1's slave and Master3 is Master2's slave and so on. A hit on the upper level master inhibits all subsequent hits. Lower level hits are only enabled by all upper level misses.

EXTENDED SINGLE CYCLE READ/WRITE RAM ARRAY

Figure 7:
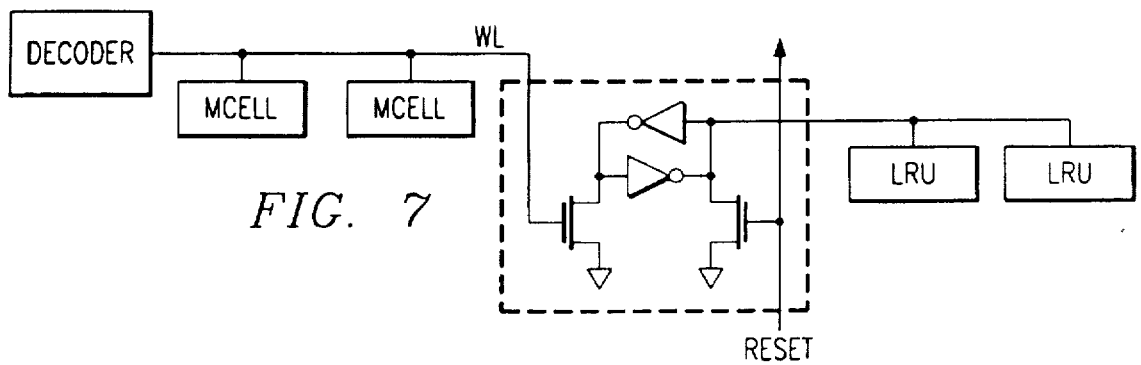
FIG. 7 is a schematic view showing the cache with tag circuitry.

Referring to FIG. 7, the microprocessor on-chip cache LRU array is incorporated into the tag array and uses the self-timing signals from the tag for its read operation. However, the LRU RAM requires the write operation to be executed right after the hit signal is generated from the tag RAM. This happens toward the end of the cycle. The LRU write operation therefore needs to be extended after the RAM read cycle, the array needs to be pre-charged before the next RAM cycle begins. This will determine the cycle time performance of the LRU array operation.

The LRU clock circuit determines when the array pre-charge occurs:

1. Tag write or tag miss: normal tag operation, tag pre-charge signal is used for the LRU array pre-charge.
2. Tag hit: use extended cycle operation. The LRU clock generates write signals to the LRU array and also to a LRU dummy cell. A pre-charge signal is generated based on the completion of the dummy cell write operation. This is used to pre-charge LRU array and dummy cell circuitry independently to the tag RAM pre-charge operation. The next cycle can begin as soon as the LRU array completes the pre-charge.

A LINE INVALIDATION CONTROL MECHANISM FOR A CACHE ARCHITECTURE WITH MULTIPLE LINES PER TAG

Figure 5:
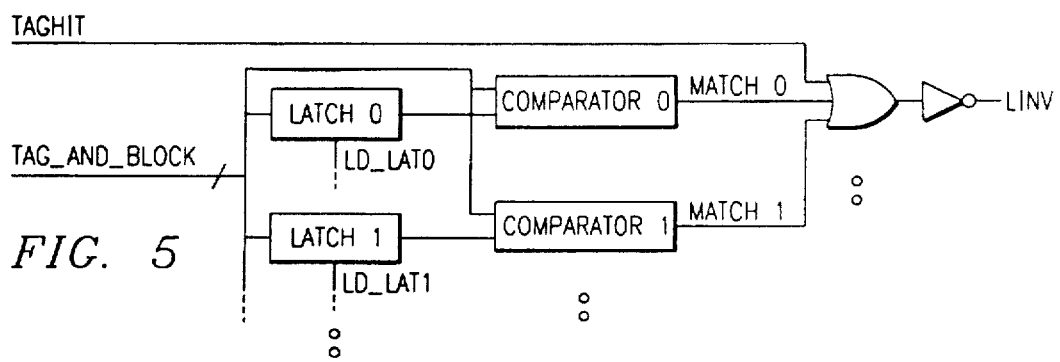
FIG. 5 is a schematic view of the tag circuitry.

Referring to FIG. 5, all the lines of a tag form a block and have the same block address. When a new tag is written for a block and one of the multiple lines in the block is being filled with valid data, it is necessary to reset the valid bits of the other lines in the block. However when a valid tag already exists, it is only necessary to manipulate the valid bits of the line in which the data is being written and the valid bits of the remaining lines of data should not be modified. The information of when to reset the valid bits of remaining lines in a block (other than the one being referenced) is provided by the line invalidation control signal.

Whenever there is a tag miss on all the ways on the block being referenced, it indicates that line invalidation control signal should be on, as a new tag will be written in the cache when this read miss requests will be serviced. Also there may already be a read miss pending request on the tag and block being currently referenced. So whenever there is a read miss request, its tag and block address is compared against all the other read miss pending requests. If there is a match it indicates that there is a request ahead on the same block and tag. In that case, the line invalidation control signal will be off even though we may have a tag miss.

What is claimed is:

1. A method for avoiding a tag duplicate fault in a 2-way set associative cache memory having, in the same level, a first tag array and a second tag array, each storing tags, and having a data RAM storing the cache data, comprising the steps of:

selecting said first tag array as a master array;

selecting said second tag array as a slave array, there being corresponding lines of memory in said first tag array and said second tag array comprising sets;

generating a tag address associated with a predetermined one of said sets;

comparing said tag address against the data stored in the line of said one of said sets in said master array while inhibiting comparison against the line of said one of said sets in said slave array; and if the result of said step of comparing is positive, using the data stored in the line of said one of said sets in said master array to access said data RAM, but if the result of said step of comparing is negative, comparing said tag address against the data stored in the line of said one of said sets in said slave array.

2. A method for avoiding a tag duplicate fault in an n-way set associative cache memory having, in the same level, n tag arrays, each storing tags, and having a data RAM storing the cache data, comprising the steps of:

selecting a first tag array as a master array;

selecting a second tag array as a first slave array;

selecting a third tag array as a third slave array, and so forth, up to the nth slave array;

there being corresponding lines of memory in each of said n tag arrays comprising sets;

generating a tag address associated with a predetermined one of said sets;

first, comparing said tag address against the data stored in the line of said one of said sets in said master array while inhibiting comparison against the line of said one of said sets in each of said slave arrays; and if the result of said first step of comparing is positive, using the data stored in the line of said one of said sets in said master array to access said data RAM, but if the result of said first step of comparing is negative, second, comparing said tag address against the data stored in the line of said one of said sets in said first slave array while inhibiting comparison against the line of said one of said sets in each of said slave arrays remaining to be compared, and if the result of said second step of comparing is positive, using the data stored in the line of said one of said sets in said first slave array to access said data RAM, but if the result of said second step of comparing is negative, third, comparing said tag address against the data stored in the line of said one of said sets in said second slave array while inhibiting comparison against the line of said one of said sets in each of said slave arrays remaining to be compared, and if the result of said third step of comparing is positive, using the data stored in the line of said one of said sets in said second slave array to access said data RAM, and so forth, until all n tag arrays have had their data compared.

* * * * *